(12) United States Patent
Yamada

(10) Patent No.: US 7,671,357 B2
(45) Date of Patent: Mar. 2, 2010

(54) METHOD OF FABRICATING SEMICONDUCTOR DEVICE

(75) Inventor: Yumi Yamada, Ibaraki (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 93 days.

(21) Appl. No.: 11/452,970

(22) Filed: Jun. 15, 2006

(65) Prior Publication Data
US 2007/0026620 A1 Feb. 1, 2007

Related U.S. Application Data

(63) Continuation of application No. PCT/JP2004/018695, filed on Dec. 15, 2004.

(30) Foreign Application Priority Data
Dec. 15, 2003 (JP) ............................. 2003-415937

(51) Int. Cl.
*H01L 29/06* (2006.01)

(52) U.S. Cl. .................. 257/14; 257/12; 257/E29.069; 257/E21.404; 438/962

(58) Field of Classification Search ................. 438/778; 257/14
See application file for complete search history.

(56) References Cited

U.S. PATENT DOCUMENTS

| 4,768,200 | A | | 8/1988 | Isshiki | |
| 5,041,888 | A | * | 8/1991 | Possin et al. | 257/59 |
| 5,949,807 | A | * | 9/1999 | Fujimoto et al. | 372/45.01 |
| 2004/0161010 | A1 | * | 8/2004 | Matsumura | 372/46 |
| 2006/0039430 | A1 | | 2/2006 | Yamada | |

FOREIGN PATENT DOCUMENTS

JP 2001-057459 2/2001

OTHER PUBLICATIONS

English Translation of Japanese patent application No. 2001-057459, Feb. 2001.*

* cited by examiner

*Primary Examiner*—Kimberly D Nguyen
*Assistant Examiner*—Tony Tran
(74) *Attorney, Agent, or Firm*—Oblon, Spivak, McClelland, Maier & Neustadt, L.L.P.

(57) ABSTRACT

A method of fabricating a semiconductor device having high output power and excellent long-term reliability by preventing thermal adverse influence exerted at the time of window structure formation is provided. The method comprises a 1st step of forming predetermined semiconductor layers 2 to 9 containing at least an active layer 4b consisting of a quantum well active layer on a semiconductor substrate 1; a 2nd step of forming a first dielectric film 10 on a first portion of the surface of the semiconductor layers 2 to 9; a 3rd step of forming a second dielectric film 12 made of the same material as that of the first dielectric film 10 and having a density lower than that of the first dielectric film 10 on a second portion of the surface of the semiconductor layers 2 to 9; and a 4th step of heat-treating a multilayer body containing the semiconductor layers 2 to 9, the first dielectric film 10, and the second dielectric film 12 to disorder the quantum well layer below the second dielectric film 12.

9 Claims, 11 Drawing Sheets

US 7,671,357 B2

METHOD OF FABRICATING SEMICONDUCTOR DEVICE

This is a continuation application of International application no. PCT/JP04/18695, filed Dec. 15, 2004, the entire content of which is incorporated herein by reference.

TECHNICAL FIELD

The present invention relates to a method of fabricating a semiconductor device that includes portions to be partially disordered, such as a window structure.

RELATED ART

Conventionally, there has been a problem that semiconductor laser devices are susceptible to instantaneous deterioration by a catastrophic optical damage (COD) and it has been a factor to prevent the semiconductor laser from having a high output power. The COD is a phenomenon in which a cycle that: a recombination current caused by non-radiative recombination flows through a light-emitting facet side of an active layer of the semiconductor laser, which results in the increase in temperature of the facet, and the increased temperature leads to further shrinkage in the band gap energy and increase in the light absorption, is created, which becomes a positive feedback to cause melting of the facet.

In order to prevent such COD, a so-called window structure, which has portions in an activity layer near the light-emitting facet made of a material with a larger band gap energy than that at the central portion of the activity layer, is effective. The window structure has a larger band gap energy at the laser light emitting facet, whereby absorption of the laser light becomes small and the COD can be suppressed.

The window structure has been conventionally formed by an independent semiconductor process. For example, portions where the windows are to be formed are removed by etching or the like, and thereafter, materials with property corresponding to the window are embedded into the portions. On the other hand, formation of the window structure is also achieved by disordering (mixed crystallization) of the portions to be the windows. When the active layer has a quantum well structure, the process of disordering is performed by ion implantation (Patent document 1), introduction of impurities (Patent document 2), dielectric film formation, and the like. All of them are processes to generate atomic vacancies in the semiconductor crystal and, by diffusion of atomic vacancies, to make the crystal structure of the quantum well active layer irregular and disordered. The portions disordered in this way exhibit properties different from those before implementing the process of disordering, for example, a different band gap energy, a different refractive index, and the like. Utilizing the above, the band gap energy near the facet of the semiconductor laser can be enlarged, and the COD can be suppressed.

Among the above processes of disordering, the process utilizing a dielectric film includes the steps that: by forming a dielectric film on the surface of a semiconductor multilayer and heating, the constituent atoms in the semiconductor are made to diffuse into the dielectric film, which generates atomic vacancies are generated in the semiconductor, and diffusion of the atomic vacancies lead to disordering of the semiconductor crystal. As the dielectric film, $SiO_2$ has been used conventionally (Patent document 3). The disordering method using dielectric films is superior to the ion implantation method or the like at the point that it introduces less defects into the crystal.

Patent document 1: Japanese Patent Application Laid-Open No. 10-200190

Patent document 2: Japanese Patent Application Laid-Open No. 2000-208870

Patent document 3: Japanese Patent Application Laid-Open No. 5-29714

However, when disordering is implemented by utilizing the dielectric film, a thermal treatment must be performed as mentioned above. Since the thermal treatment is performed on the entire semiconductor laser device, it may sometimes adversely affects portions not to be disordered. For example, when the active layer is made of AlGaAs based material, there has been a problem that As atoms are desorbed from the semiconductor surface corresponding to the active layer region not to be disordered and the semiconductor surface is roughed. Therefore, favorable contact is not assured when an electrode is formed on a contact layer, which affects adversely the performance characteristics of the semiconductor laser.

Also, desorption of As leaves pits (small holes) on the semiconductor surface, and dislocation defects are generated by the pits. This is explained using FIG. 12. FIG. 12 is a longitudinal section of a semiconductor laser device having conventional window structures in the direction of a laser resonator, schematically showing events during the thermal treatment for disordering. In FIG. 12, the window 28 is constituted by forming a $SiO_2$ disordering-enhancing film 42 on the surface of the semiconductor laser at the upper part of the window formation region 28a, and by performing the thermal treatment for disordering. In this process, As atoms are desorbed from the semiconductor laser device surface in the region 28b where the window is not formed, and leave pits. The pits propagate, forming dislocation defects 41, reach the active layer 4, and deteriorate the laser performance or spoil the long-term reliability.

Adverse effects by the thermal treatment have not been restricted to the portions not to be disordered, as mentioned above. That is, also on the portion to be disordered, oxygen atoms from the $SiO_2$ disordering-enhancing film 42 mingle into the semiconductor crystal to become crystal defects and have been the cause to spoil the long-term reliability of a semiconductor laser.

The present invention has been made in view of the above problems. An object of the present invention is to prevent the adverse effects of thermal treatment when the window structure or the like is formed in a semiconductor laser device, and to enable fabricating a semiconductor device of high output power and excellent long-term reliability.

SUMMARY OF THE INVENTION

The present invention is made in order to attain the above-mentioned object, and relates to a method of fabricating a semiconductor device that includes disordered portions.

A method of fabricating a semiconductor device according to a first embodiment of the invention comprising the steps of:

forming a predetermined semiconductor multilayer which includes at least an active layer consisting of a quantum well active layer on a semiconductor substrate;

forming a first dielectric film on a first portion of the surface of said semiconductor multilayer;

forming a second dielectric film made of the same material as said first dielectric film and having a lower density than said first dielectric film on a second portion of the surface of said semiconductor multilayer;

performing thermal treatment of a multilayer body containing said semiconductor multilayer, said first dielectric film and said second dielectric film, to disorder said quantum well layer under said second dielectric film; and cleaving said multilayer body at nearly the central part of said second portion.

A method of fabricating a semiconductor device according to a second embodiment of the invention comprising the steps of:

forming a predetermined semiconductor multilayer which includes at least a quantum well active layer on a semiconductor substrate;

forming a first dielectric film on a first portion of the surface of said semiconductor multilayer;

forming a second dielectric film made of the same material as said first dielectric film and having a lower refractive index than said first dielectric film on a second portion of the surface of said semiconductor multilayer;

performing thermal treatment of a multilayer body containing said semiconductor multilayer, said first dielectric film and said second dielectric film, to disorder said quantum well layer under said second dielectric film; and cleaving said multilayer body at nearly the central part of said second portion.

In the method of fabricating the semiconductor device according to a third embodiment of the invention, the refractive index of said first dielectric film is larger than a predetermined value determined depending on the film formation conditions of said first dielectric film and said second dielectric film, and the refractive index of said second dielectric film is smaller than said predetermined value.

A method of fabricating a semiconductor device according to a fourth embodiment of the invention comprising the steps of:

forming a predetermined semiconductor multilayer which includes at least a quantum well active layer on a semiconductor substrate;

forming a first dielectric film containing silicon on a first portion of the surface of said semiconductor multilayer;

forming a second dielectric film made of the same material as said first dielectric film and with a lower silicon composition ratio than said first dielectric film on a second portion of the surface of said semiconductor multilayer;

performing thermal treatment of a multilayer body containing said semiconductor multilayer, said first dielectric film and said second dielectric film, to disorder said quantum well layer under said second dielectric film; and cleaving said multilayer body at nearly the central part of said second portion.

In the method of fabricating the semiconductor device according to a fifth embodiment of the invention, the silicon composition ratio of said first dielectric film is larger than the stoichiometric composition ratio of said dielectric film, and the silicon composition ratio of said second dielectric film is smaller than the stoichiometric composition ratio of said dielectric film.

A method of fabricating a semiconductor device according to a sixth embodiment of the invention comprising the steps of:

forming a predetermined semiconductor multilayer which includes at least a quantum well active layer on a semiconductor substrate;

forming a first dielectric film on a first portion of the surface of said semiconductor multilayer;

forming a second dielectric film made of the same material as said first dielectric film and having a higher hydrogen concentration in the film than said first dielectric film on the second portion of the surface of said semiconductor multilayer;

performing thermal treatment of a multilayer body containing said semiconductor multilayer, said first dielectric film and said second dielectric film, to disorder said quantum well layer under said second dielectric film; and cleaving said multilayer body at nearly the central part of said second portion.

In the method of fabricating the semiconductor device according to a seventh embodiment of the invention, said first dielectric film and said second dielectric film are silicon nitride films.

In the method of fabricating the semiconductor device according to an eighth embodiment of the invention, said first dielectric film is formed by the steps of:

arranging a heat source in a chamber on a path through which a first precursor of said first dielectric film passes to cause a decomposition reaction of said first precursor in the presence of said heat source, and exposing said first portion of said semiconductor device in said chamber; and said second dielectric film is formed by the steps of:

arranging a heat source in said chamber on a path through which a second precursor of said second dielectric film passes to cause a decomposition reaction of said second precursor in the presence of said heat source, and exposing said second portion of said semiconductor device in said chamber.

In the method of fabricating the semiconductor device according to a ninth embodiment of the invention, said first dielectric film is formed by the steps of:

arranging a heat source in a chamber on a path through which a first precursor of said first dielectric film passes to cause a decomposition reaction of said first precursor in the presence of said heat source, and exposing said first portion of said semiconductor device in said chamber; and said second dielectric film is formed by the steps of:

arranging a heat source in said chamber on a path through which a second precursor of said second dielectric film passes to cause a decomposition reaction of said second precursor in the presence of said heat source, and exposing said second portion of said semiconductor device in said chamber; and said first and second precursors are compounds containing nitrogen and silicon, or mixtures of nitrogen compounds and silicon compounds.

In the method of fabricating the semiconductor device according to a tenth embodiment of the invention, said first precursor and said second precursor contain silane and ammonia, and the silane content in said first precursor is larger than the silane content in said second precursor.

In the method of fabricating the semiconductor device according to an eleventh embodiment of the invention, said first dielectric film and second dielectric film are respectively formed by the step of causing decomposition reactions of said first precursor and said second precursor with catalytic CVD method.

In the method of fabricating the semiconductor device according to a twelfth embodiment of the invention, said predetermined semiconductor multiplayer is formed by the steps of:

forming an optical waveguide layer, at least on one side of said quantum well layer in the layer forming direction, and embedding a semiconductor layer with a conduction type opposite to the conduction type of said optical waveguide layer into said optical waveguide layer at the portion beneath said second portion.

In the method of fabricating the semiconductor device according to a thirteenth embodiment of the invention, said predetermined semiconductor multiplayer is formed by the steps of:

forming optical waveguide layers having band gap energies larger than the band gap energy of said quantum well layer on both sides of said quantum well layer in the layer forming direction, respectively;

forming cladding layers having band gap energies larger than the band gap energies of said optical waveguide layers on both sides in the layer forming direction of the multilayer structure consisting of said quantum well layer and said optical waveguide layers, respectively; and forming career block layers having band gap energies larger than each band gap energy of said optical waveguide layers between said quantum well layer and said optical waveguide layers.

In the method of fabricating the semiconductor device according to a fourteenth embodiment of the invention, said predetermined semiconductor multiplayer is formed by the step of forming either a single or a multiple quantum well structure.

The method of fabricating the semiconductor device according to the present invention comprises also the following other modes.

A protective film formation process of forming a first dielectric film as a protective film on the surface of a semiconductor device at a portion corresponding at least to the portion not to be disordered; a disordering-enhancing film formation process of forming a second dielectric film made of the same material as said first dielectric film and having lower density than said first dielectric film, on the surface of the semiconductor device at the portion corresponding at least to the portion to be disordered, as a disordering-enhancing film; and a disordering process of disordering said portion to be disordered by thermal treatment.

A protective film formation process of forming a first dielectric film as a protective film on the surface of a semiconductor device at a portion corresponding at least to the portion not to be disordered; a disordering-enhancing film formation process of forming a second dielectric film made of the same material as said first dielectric film and has lower refractive index than said first dielectric film, as a disordering-enhancing film, on the surface of the semiconductor device at a portion corresponding at least to the portion to be disordered; and a disordering process of disordering said portion to be disordered by thermal treatment. This mode may include that the refractive index of said first dielectric film is larger than the predetermined value determined dependent on the film formation conditions of said first dielectric film and said second dielectric film; and the refractive index of said second dielectric film is smaller than said predetermined value.

A protective film formation process of forming a first dielectric film containing silicon as a protective film on the surface of a semiconductor device at a portion corresponding at least to the portion not to be disordered; a disordering-enhancing film formation process of forming a second dielectric film made of the same material as said first dielectric film and having lower Si composition ratio than said first dielectric film as a disordering-enhancing film on the surface of the semiconductor device at the portion corresponding at least to the portion to be disordered, and a disordering process of disordering said portion to be disordered by thermal treatment. This mode may contain that the Si composition ratio of said first dielectric film is larger than the stoichiometric composition ratio of said dielectric film, and the Si composition ratio of said second dielectric film is smaller than the stoichiometric composition ratio.

A protective film formation process of forming a first dielectric film as a protective film on the surface of a semiconductor device at a portion corresponding at least to the portion not to be disordered; a disordering-enhancing film formation process of forming a second dielectric film made of the same material as said first dielectric film and a has higher hydrogen concentration in the film than said first dielectric film as a disordering-enhancing film on the surface of the semiconductor device at a portion corresponding at least to the portion to be disordered; and a disordering process of disordering said portion to be disordered by thermal treatment.

Said first dielectric film and said second dielectric film are silicon nitride films.

Said protective film formation process is performed by arranging a heat source on a path through which a first precursor of the first dielectric film to be formed passes, to cause a decomposition reaction of said first precursor in the presence of said heat source, and exposing at least a portion of the surface of said semiconductor device corresponding to the portion not to be disordered to the atmosphere remained after said decomposition reaction; and said disordering-enhancing film formation process is performed by arranging a heat source on a path through which a second precursor of said second dielectric film to be formed passes, to cause a decomposition reaction of said second precursor in the presence of said heat source, and exposing at least a portion of the surface of said semiconductor device corresponding to the portion to be disordered to the atmosphere remained after said decomposition reaction.

Said protective film formation process is performed by arranging a heat source on a path through which a first precursor of the first dielectric film to be formed passes, to cause a decomposition reaction of said first precursor in the presence of said heat source, and exposing at least a portion of the surface of said semiconductor device corresponding to the portion not to be disordered to the atmosphere remained after said decomposition reaction; and said disordering-enhancing film formation process is performed by arranging a heat source on a path through which a second precursor of said second dielectric film to be formed passes, to cause a decomposition reaction of said second precursor in the presence of said heat source, and exposing at least a portion of the surface of said semiconductor device corresponding to the portion to be disordered to the atmosphere remained after said decomposition reaction; and said first and second precursors are compounds containing nitrogen and silicon, or mixtures of nitrogen compounds and silicon compounds.

Said first precursor and said second precursor contain silane ($SiH_4$) and ammonia ($NH_3$), and the silane content in said first precursor is larger than the silane content in said second precursor. Thereby, the first dielectric film with a large silicon composition ratio and high density, and the second dielectric film with a small silicon composition ratio and low density, are formed.

Said protective film formation process and said disordering-enhancing film formation process are performed by utilizing catalytic chemical vapor deposition (CVD) method.

Said semiconductor device has said disordered portion constituting, at least in the vicinity of one of the facets in the resonance direction, a window structure where laser light is not absorbed, and the portion not disordered constituting an active layer with the quantum well structure. In this mode said semiconductor device may have current a non-injection region which block current injection into said disordered portion. It is preferable that the length Ln of said current non-injection region measured from said facet of said semiconductor device is in the range of Lw≦Ln≦Lw+10 μm, setting the length of said disordered portion measured from said facet of the semiconductor device to be Lw. Moreover, it is preferable that said current non-injection region is embedded in said semiconductor device and is a semiconductor layer having the conduction type opposite to that of the surrounding semiconductor layer.

Said semiconductor device is provided with: n-type and p-type optical waveguide layers having a band gap energy larger than the band gap energy of a said active layer on both sides of the active layer in the layer forming direction, respectively; n-type and p-type cladding layers having a band gap energy larger than the band gap energy of said optical waveguide layers, in a way to sandwich said active layer and said optical waveguide layer from both sides in the layer forming direction, respectively, and carrier block layers having a band gap energy larger than each band gap energy of said active layer and said optical waveguide layer between said active layer and said optical waveguide layers.

In the present invention, it is expected that when a dielectric film with high compactness and high density is formed on a semiconductor crystal, its activity to absorb Ga atoms may be small, but when a dielectric film with small density is formed on the semiconductor crystal, its activity to absorb Ga atoms may be large. Thus, atomic vacancies are easily formed in the portion of the semiconductor crystal above which a dielectric film with small density was formed, and atomic vacancies are rarely formed in the portion above which a dielectric film with large density was formed, and thus, upon thermal treatment, disordering of the multiple quantum well takes place under the dielectric film with small density, but does not under the dielectric film with large density. That is, upon disordering, a dielectric film with large density will function as a protective film, and a dielectric film with small density as an enhancing film.

On the other hand, it is known that magnitudes of physical properties of dielectric films including densities can be judged by the magnitudes of refractive indices. The present inventor has found that whether any of the first and second dielectric films functions as a protective film or as a disordering-enhancing film, respectively, is possible to be judged by focusing attention on the refractive indices of dielectric films, especially on the basis of predetermined values determined depending on film formation conditions, including film formation temperature and pressure, and film formation apparatus. That is, if the refractive index of the formed first dielectric film is larger than a predetermined value and the refractive index of the second dielectric film is smaller than said predetermined value, the first dielectric film can function as a protective film and the second dielectric film as a disordering-enhancing film in the disordering thermal treatment performed afterwards.

In the present invention, the magnitude of the density of a dielectric film can also be distinguished by the magnitude of the composition ratio of Si in it. That is, focusing attention on the composition ratios of Si in the first and second dielectric films, if Si composition of the formed first dielectric film is larger than the stoichiometric composition ratio of said dielectric film and Si composition of the second dielectric film is smaller than the stoichiometric composition ratio of said dielectric film, the first dielectric film can function as a protective film and the second dielectric film as a disordering-enhancing film in the disordering thermal treatment performed afterwards.

Further, focusing attention on the quantity of the hydrogen contained in the first and second dielectric films, if the quantity of hydrogen in the first dielectric film is smaller than the quantity of hydrogen in the second dielectric film, the first dielectric film can work as a protective film and the second dielectric film as a disordering-enhancing film.

As for two kinds of dielectric films distinguished by each of above-mentioned standards, the first dielectric film has a high density and its activity to absorb Ga atoms is small when it is formed on a semiconductor crystal, while the second dielectric film has a low density and its activity to absorb Ga atoms is large when it is formed on a semiconductor crystal. For this reason, atomic vacancies are easily formed in the portion of the semiconductor crystal under the second dielectric film, and the atomic vacancy is hardly formed in the portion under the first dielectric film. And thus, upon thermal treatment, disordering of a multiple quantum well takes place in the portion under the second dielectric film, but does not take place in the portion under the first dielectric film. That is, upon disordering treatment, the first dielectric film will function as a protective film, and the second dielectric film will function as an enhancing film.

Said semiconductor device is, for example, a semiconductor laser device or the like, which has said disordered portion constituting a window structure which does not absorb laser light located in the vicinity of at least one of the facets in the resonance direction, and the non-disordered portion constituting an active layer of a quantum well structure.

Further, said semiconductor laser device is preferably equipped with a current non-injection region which blocks current injection into the disordered portion. It is especially preferable that the length Ln of the current non-injection region is in the range of Lw≦Ln≦Lw+10 μm, setting the length of said disordered portion to Lw. Here, the term length refers to the length along the direction of the resonator. It is also preferable that the current non-injection region is embedded in said semiconductor laser device and is a semiconductor layer having the conduction type opposite to that of the surrounding semiconductor layer.

It is also particularly preferable that the above-mentioned semiconductor device is equipped with: n-type and p-type optical waveguide layers having a band gap energy larger than the band gap energy of said active layer on both sides of the active layer, respectively; n-type and p-type cladding layers having a band gap energy larger than the band gap energy of said optical waveguide layer, in a way to sandwich said active layer and said optical waveguide layer, respectively; and carrier block layers having a band gap energy larger than that of each of said active layers and optical waveguide layers, between said active layers and said optical waveguide layers.

According to the present invention, upon fabrication of a semiconductor device, especially of a semiconductor laser device provided with a window structure, a protecting film was formed on the semiconductor device surface corresponding to the portion not to be disordered, and a disordering-enhancing film on the semiconductor device surface corresponding to the portion to be disordered, in advance of the disordering process, especially by the method utilizing the decomposition reaction of the precursor represented by catalytic CVD method; so that adverse effects caused by the thermal treatment on the portion not to be disordered does not occur, and a semiconductor laser device of high output power and excellent long-term reliability can be provided.

In the above-mentioned method utilizing the decomposition reaction of the precursor, the precursor is a compound containing nitrogen and silicon or a mixture of nitrogen compounds and silicon compounds, so that mixing of oxygen into the semiconductor crystal under the thermal treatment for disordering does not take place, and a semiconductor device of excellent long-term reliability can be provided.

Further, the current non-injection region is provided corresponding to the disordered portion, so that current will not be injected into the portion with atomic vacancies formed by the disordering thermal treatment, and the reliability of the crystal quality is improved. In addition, the non-light emitting recombination near the facet is suppressed, which is still more effective for prevention of COD, in combination with the window structure made by the disordering process.

In addition, in the semiconductor laser device of the window structure type fabricated utilizing the above-mentioned method, carrier block layers having band gap energies larger than each of the band gap energies of the active layer and the optical waveguide layer were provided between said active layers and said optical waveguide layers, so that, especially on the semiconductor laser device of an AlGaAs system, an optical waveguide layer can be constituted by a layer of low aluminum (Al) or a layer of GaAs. Because of this, the quality of the re-grown interface accompanying with the fabrication of the current non-injection layer can be improved, and so the rise of the operation voltage can be avoided and a semiconductor laser device of excellent long-term reliability can be provided.

The inventor of the present invention have found out that by adjusting the composition of the dielectric film, a difference can be introduced into the ability of the dielectric film to absorb the constituent atoms from the compound semiconductor. Utilizing this principle, the inventor has completed the present invention relating to a new method of fabricating a semiconductor laser device. That is, the present invention provides a method of fabricating a quantum well semiconductor laser device having a window structure formed by disordering the quantum well structure. The method has a step of forming a protective film to prevent disordering on the portion where the quantum well structure is not to be disordered, and a step of forming a disordering-enhancing film on the portion where the quantum well structure is to be disordered. By choosing the composition of the dielectric film to be formed in each step, respectively, it becomes possible to construct differentially either a protective film or a disordering-enhancing film very easily and surely. Therefore, according to the present invention, the process of fabricating a semiconductor laser device having a region with disordered quantum wells, such as a window structure for COD prevention for example, will be simplified, and the yield will be improved.

THE DETAILED DESCRIPTION OF THE INVENTION

Hereafter, based on the drawings, a method of fabricating a semiconductor device according to an embodiment of the present invention is explained.

[Fabricating Method]

FIGS. 1 to 5 are cross sections illustrating the method of fabricating a semiconductor device according to an embodiment of the present invention. This semiconductor device is a semiconductor laser device of multiple quantum well (MQW) structure emitting laser light of 0.98 μm band. FIGS. 1(a) and 1(b) are figures, cross sections along the direction of a resonator, illustrating epitaxial wafer fabrication of the semiconductor laser device. FIGS. 5(a) and 5(b) show the cross sections of the epitaxial wafer fabrication in the direction perpendicular to the direction of the resonator. These figures are drawn by extracting the region that constitutes one semiconductor laser device later.

Figure 4A:
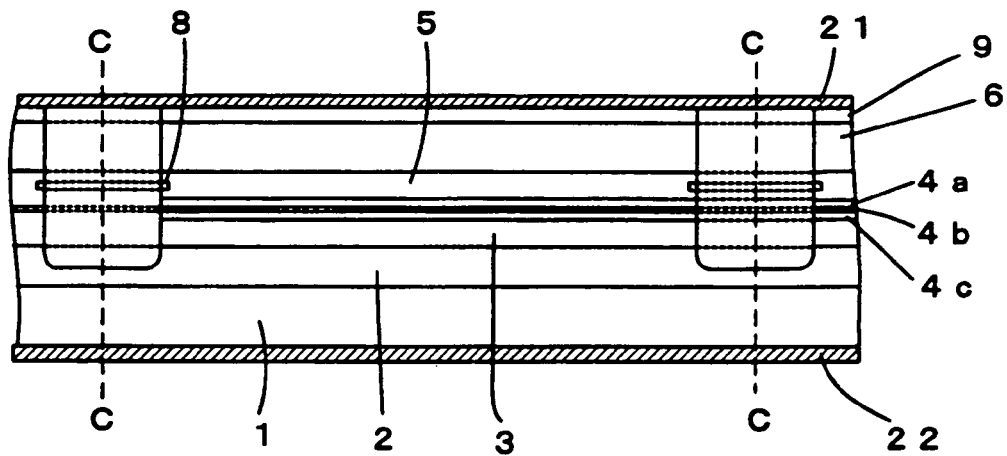
FIGS. 4 (a) and 4 (b) are cross sections illustrating processes of cleavage of and formation of a high reflective and a low reflective films on the semiconductor laser device according to an embodiment of the present invention.
Figure 4B:
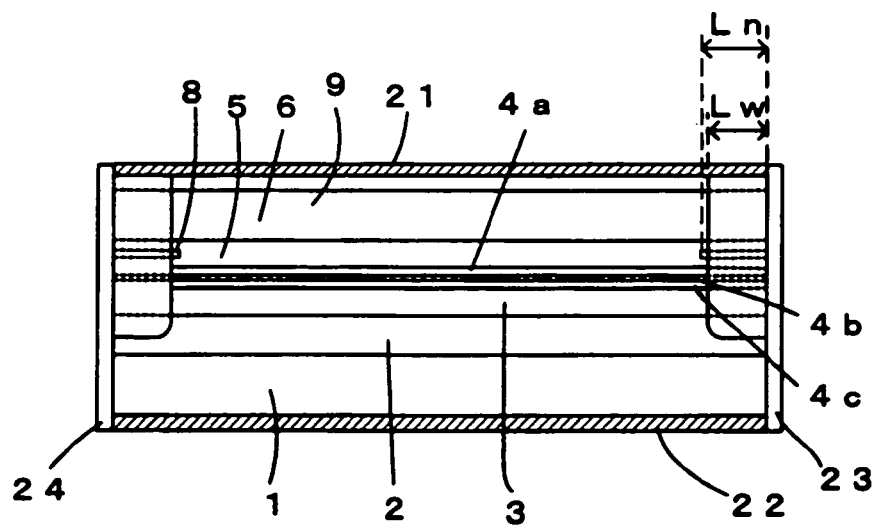

First, as shown in FIG. 1 (a) and FIG. 4 (a), an $Al_{0.08}Ga_{0.92}As$ lower cladding layer 2 with a thickness of 2.4 μm and a GaAs lower waveguide layer 3 with a thickness of 0.48 μm are grown on a GaAs semiconductor substrate 1 in this order. On the lower waveguide layer 3, an $Al_{0.4}Ga_{0.6}As$ lower carrier block layer 4c with a thickness of 0.035 μm, a multiple quantum well active layer 4b with two stacked $In_{0.14}Ga_{0.86}As$ quantum well layers each with a thickness of 0.01 μm, and a $Al_{0.4}Ga_{0.6}As$ upper carrier block layer 4a with a thickness of 0.035 μm are formed. The structure including these carrier block layers 4a and 4c is a decoupled confinement heterostructure (DCH), explained later. After forming a GaAs upper waveguide layer 5 on the upper carrier block layer 4a partway, a stripe-shaped $Al_{0.32}Ga_{0.68}As$ current non-injection layer 8 with a thickness of 0.055 μm is selectively formed in the region stretching from the position where a facet is to be made later to the position 20 μm apart in the center direction. The current non-injection layer 8 is also formed in the region on both sides of a stripe-shaped resonator in the longitudinal direction, and thereby, the current injection region of the multiple quantum well active layer 4b is defined in the stripe shape. Here, the conduction type of the current non-injection layer 8 is made to be opposite to the conduction type of the upper cladding layer 6 to be formed later.

Next, as shown in FIG. 1 (b) and FIG. 4 (b), the remaining upper waveguide layer 5 is formed. The thickness of the upper waveguide layer 5 containing the current non-injection layer 8 becomes 0.45 μm. Further, a $Al_{0.32}Ga_{0.68}As$ upper cladding layer 6 with a thickness of 0.8 μm and a GaAs contact layer 9 with a thickness of 0.3 μm are formed successively.

In addition, as for dopants doped in each layer, from the semiconductor substrate 1 to the contact layer 9, silicon is doped, for example, into the semiconductor substrate 1, the lower cladding layer 2, the lower waveguide way 3, the current non-injection layer 8 and the lower carrier block layer 4c, in order to make their conduction types n-type; and zinc is doped, for example, into the upper waveguide layer 3, the upper cladding layer 6, the contact layer 9 and the upper carrier block layer 4a, in order to make their conduction types p-type. The multiple quantum well active layer 4b is grown undoped.

Figure 2A:
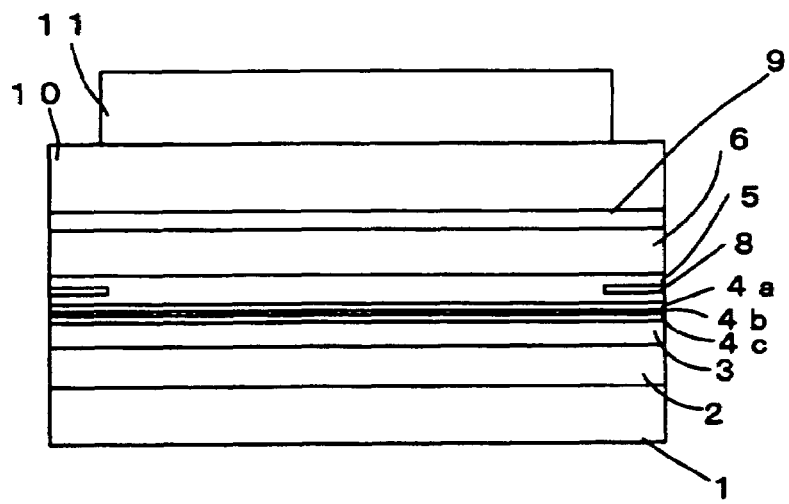
FIGS. 2 (a) to 2(c) are cross sections illustrating processes of formation and patterning of dielectric films for forming window structures of a semiconductor laser device according to an embodiment of the present invention.
Figure 2B:
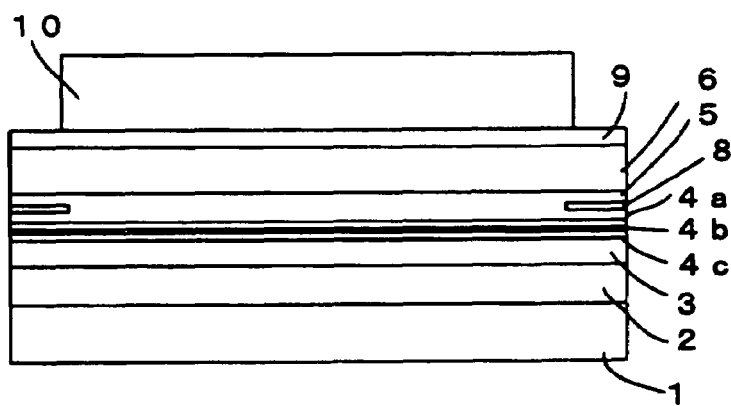
Figure 2C:
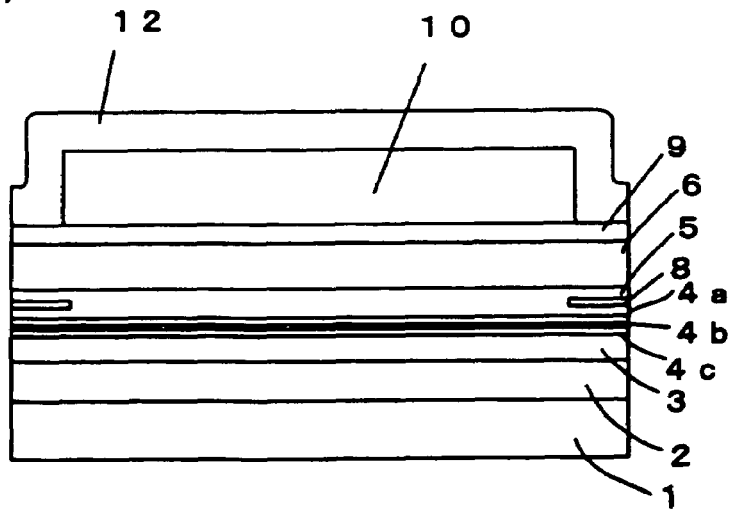

FIGS. 2(a) to 2(c) are cross sections along the direction of the resonator, showing the process of forming a dielectric film on the upper surface of the epitaxial wafer in advance of the thermal treatment for disordering (mixed crystallization) in order to form the window structures.

First, as shown in FIG. 2 (a), a $SiN_{x1}$ protective film 10 having the thickness of 50 nm is deposited on the entire upper surface of the contact layer 9, using catalytic CVD method. The $SiN_{x1}$ protective film 10 is a film with high compactness and small internal stress. Next, resist is applied to the upper surface of the $SiN_{x1}$ protective film 10, and patterning is performed on the resist by photolithography to form a resist mask 11 which covers the region not to be disordered, as mentioned later.

Then, after the $SiN_{x1}$ protective film 10 in the region not covered with the resist mask 11 is etched by the reactive ion etching (RIE) using carbon tetrafluoride ($CF_4$), the resist mask 11 is removed with organic solvent. Thereby, as shown in FIG. 2 (b), the contact layer 9 is in an exposed state not being covered with $SiN_{x1}$ protective film 10 in the region to be disordered; and in the region other than that, it is in the state covered with the $SiN_{x1}$ protective film 10.

As shown further in FIG. 2 (c), using catalytic CVD method, a $SiN_{x2}$ disordering-enhancing film 12 having the thickness of 25 nm is formed on the entire upper surfaces of the exposed contact layer 9 and the $SiN_{x1}$ protective film 10. The composition ratio x2 of the $SiN_{x2}$ disordering-enhancing film 12 differs from the composition ratio x1 of $SiN_{x1}$ protective film 10. An explanation will be given later on this point.

Figure 3A:
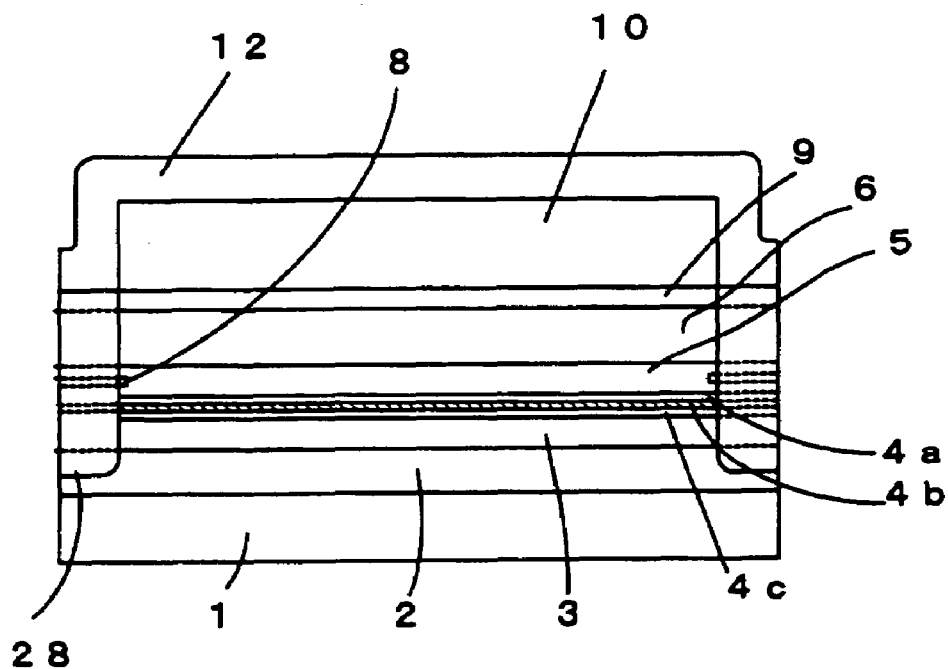
FIGS. 3 (a) and 3 (b) are longitudinal sections illustrating processes for forming window structures of the semiconductor laser device according to an embodiment of the present invention.
Figure 3B:
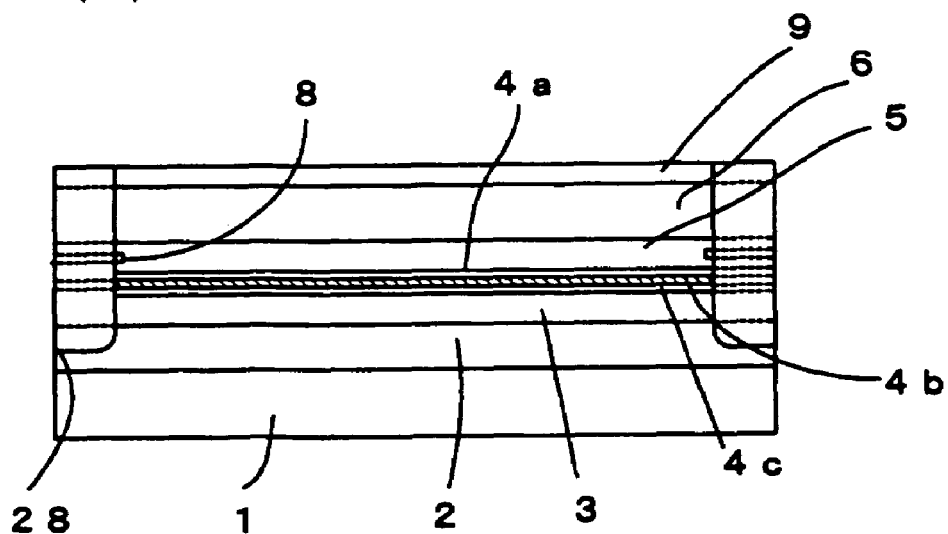
Figure 6:
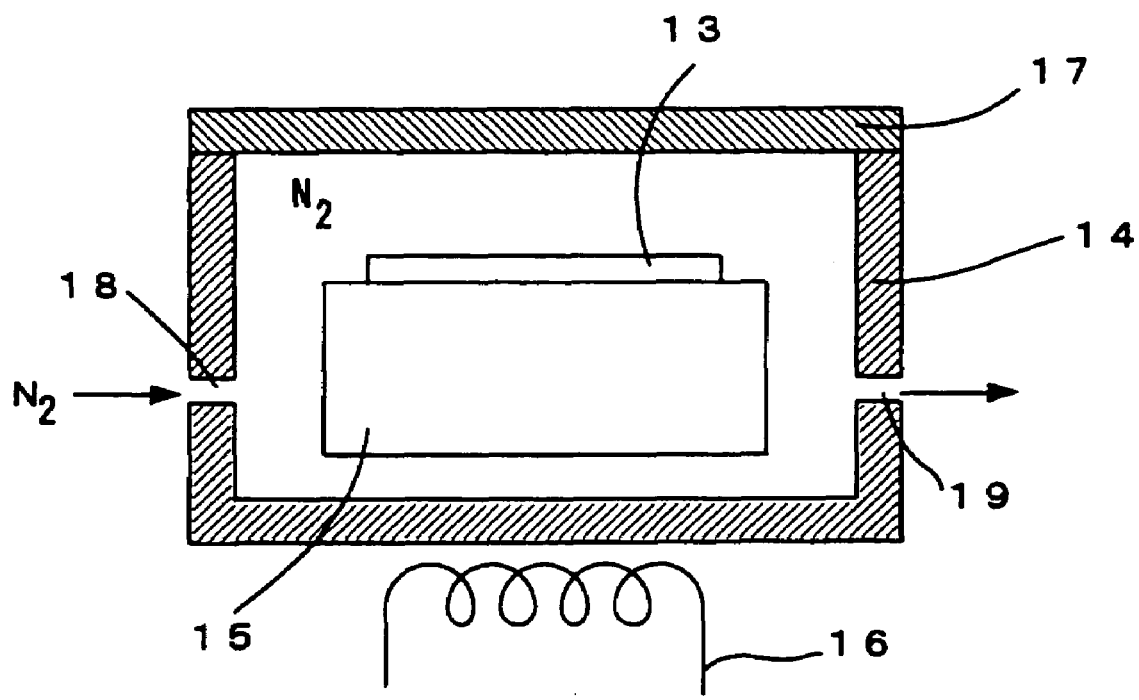
FIG. 6 is a cross section illustrating a heating apparatus for forming the window structure of the semiconductor laser device according to an embodiment of the present invention.

FIGS. 3 (a) and 3 (b) are cross sections illustrating a process of thermal treatment for disordering to form the window structure using a device shown in FIG. 6.

An epitaxial wafer 13 equipped with a $SiN_{x1}$ protective film 10 and a $SiN_{x2}$ disordering-enhancing film 12 as described above is placed on a mount 15 made of silicon carbide (SiC) installed in a quartz tray 14 as shown in FIG. 6. Then, in nitrogen ($N_2$) gas atmosphere, a short-time thermal treatment (RTA: Rapid Thermal Anneal) for 30 seconds at the temperature of 930° C. with a lamp heater 16 arranged under the quartz tray 14, is performed. By performing the RTA, gallium (Ga) atoms are absorbed by the $SiN_{x2}$ disordering-enhancing film 12 from the layer under the $SiN_{x2}$ disordering-enhancing film 12, and atomic vacancies are generated near the surface of the contact layer 9. The atomic vacancies diffuse and reach especially the multiple quantum well active layer 4b, so that disordering takes place to form windows 28 as shown in FIG. 3 (a). The quartz tray 14 has a lid 17 on it, and nitrogen gas is made to flow in and out the tray through the gas inlet 18 and the gas outlet 19, with a flow rate of 2 L/min, for example.

Then, as shown in FIG. 3 (b), the $SiN_{x1}$ protective film 10 and the $SiN_{x2}$ disordering-enhancing film 12 are removed by hydrofluoric acid.

Subsequently, the semiconductor laser device is completed according to a process illustrated in FIGS. 4 (a) and 4(b). That is, after forming an upper electrode 21 and a lower electrode 22, the multilayer body is cleaved at the position near the center (position shown by dashed line C) of the disordered regions in FIG. 4 (a), and is separated as a laser bar consisting of plural semiconductor laser devices (the longitudinal direction of the bar is perpendicular to the page space). Out of the cleaved facets of the laser bar thus separated, the light-emitting facet is coated by a low reflection film 23, and the light-reflecting facet is coated by a high reflection film 24 as shown in FIG. 4 (b). Finally, by being cut parallel to the page space, each semiconductor laser device in the laser bar is separated in a chip shape, and the semiconductor laser device is completed.

The upper electrode 21 is a multiple metal layer formed on the contact layer 9 consisting of, for example, titanium (Ti), platinum (Pt), and gold (Au) layers sequentially, and the lower electrode 22 is constituted with a structure formed at the undersurface of the semiconductor substrate 1, for example, by gold, germanium, nickel (AuGeNi) alloy or with a gold layer on it in addition.

[Explanation of Dielectric Film Fabrication by Catalytic CVD Method]

Figure 7:
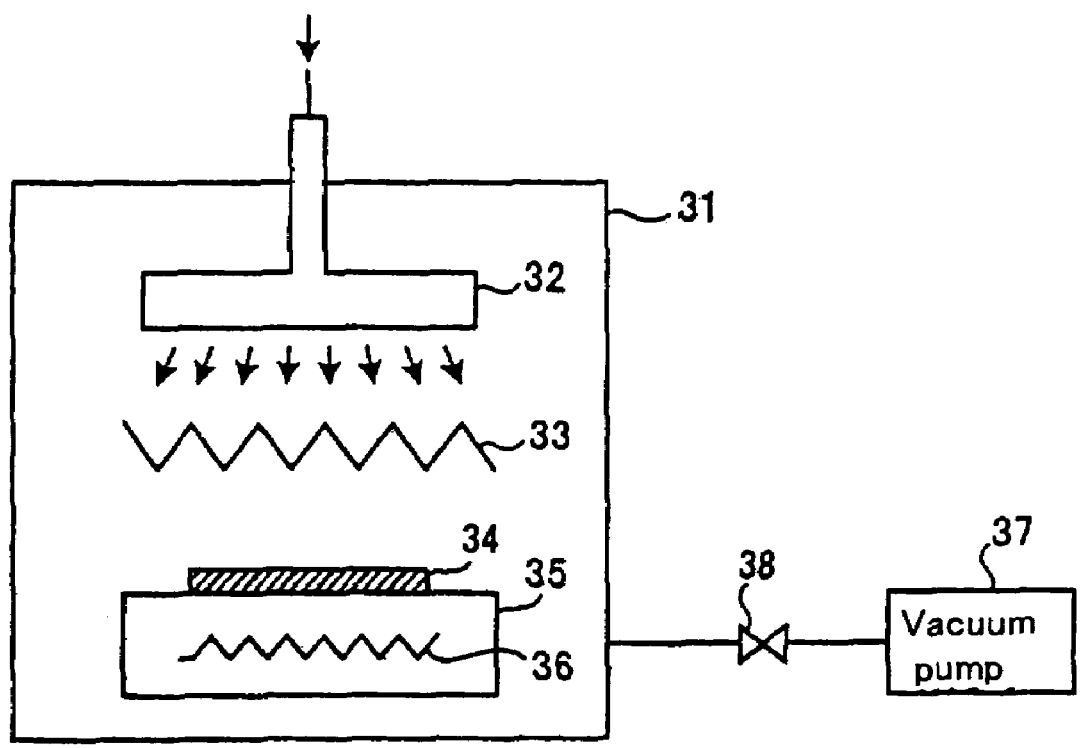
FIG. 7 is a schematic diagram illustrating the constitution of catalytic CVD method according to an embodiment of the present invention.

The $SiN_{x1}$ protective film 10 and the $SiN_{x2}$ disordering-enhancing film 12 which are formed by the processes illustrated in FIGS. 2 (a) to 2 (c) are formed with catalytic CVD method, as described above. FIG. 7 is a diagram showing the outlined constitution of a catalytic CVD apparatus.

In the catalytic CVD apparatus shown in FIG. 7, a vacuum pump 37 is connected to a chamber 31 through a pressure adjustment valve 38. In the chamber 31, a substrate holder 35 having a substrate heater 36 is provided. On the substrate holder 35, an epitaxial wafer 34, on which a protective film 10 and a disordering-enhancing film 12 are to be deposited, is placed. In the chamber 31, a tungsten wire 33 for heating is provided above the epitaxial wafer 34, and a showerhead 32 is further provided above the wire.

When the protective film 10 or the disordering-enhancing film 12 is deposited using the catalytic CVD apparatus having such a constitution, the substrate heater 36 is pre-heated at about 200° C. to about 300° C. before the epitaxial wafer 34 is placed on the substrate holder 35. Then, the vacuum pump 37 is operated after placing the epitaxial wafer 34, and the inside of the chamber 31 is decompressed to a predetermined pressure, for example, about $1 \times 10^{-4}$ Pa.

Ammonia (NH$_3$) is introduced into the chamber 31 via the shower head 32 at a predetermined flow rate f$_{NH3}$, and the tungsten wire 33 is electrified at the same time so as to maintain the temperature of the tungsten wire 33 at 1650° C. Silane (SiH$_4$) is introduced via the shower head 32 at a predetermined flow rate of f$_{SiH4}$ to keep the pressure in the chamber 31 at 4.0 Pa.

The molecules of SiH$_4$ and NH$_3$ introduced in the chamber 31 contact the tungsten wire 33 heated to about 1600° C. to about 2000° C., and, catalyzed thereby, decompose and are activated into SiH$_y$ and NH$_z$, which are thermally desorbed and react on the wafer 34 heated with the substrate-heater 36, and deposit on the wafer in the form of SiN$_x$.

By the way, both SiN$_{x1}$ protective film 10 and SiN$_{x2}$ disordering-enhancing film 12 are SiN$_x$ formed by above-described catalytic CVD method, and whether the SiN$_x$ may function as the protective film 10 or as the disordering-enhancing film 12 is determined by its composition. That is, by setting up appropriately the above-described source gas flow rates f$_{NH3}$ and f$_{SiH4}$, it is possible to construct differentially either the protective film 10 or the disordering-enhancing film 12 using catalytic CVD method.

For example, in the case of fabricating the semiconductor laser of 980 nm band, under the condition that the film is formed by setting the gas pressure at the time of film formation, that is, the pressure in the chamber 31, to be 4.0 Pa, the present inventor has found that, separated by a boundary where the deposited SiN$_x$ has a composition at which the refractive index is nearly 1.96, the deposited film functions differently: that is, the film with the composition of more Si than that (the refractive-index>1.96) has higher atomic density and functions as the protective film 10; and the film with the composition of less Si (the refractive-index<1.96) has lower atomic density and functions as the disordering-enhancing film 12.

Figure 8:
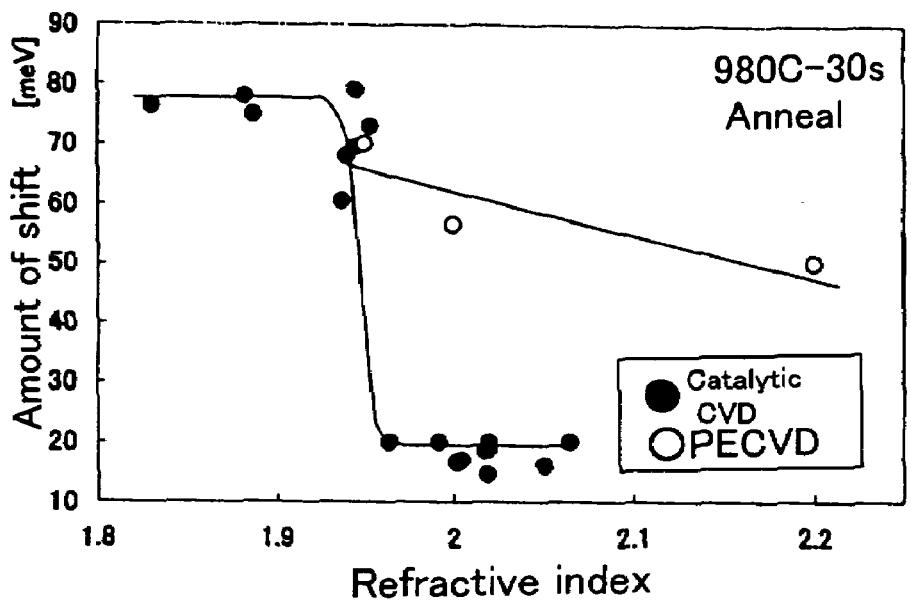
FIG. 8 is a graph showing the relationship between the refractive index of a deposited SiN film (abscissa), and the amount of energy shift of the photoluminescence spectrum peak wavelength of wafers between before and after the heat treatment (meV, ordinate), in the case where a SiN film is formed on the compound semiconductor epitaxial wafer containing quantum well structure, using catalytic CVD method and plasma CVD method.

For example, FIG. 8 shows measurements of the following experiment. SiN$_x$ films of various composition were deposited on the surface of the epitaxial wafer for fabricating the semiconductor laser explained in the embodiment, by keeping the flow rate of ammonia constant and changing the flow rate of silane, then thermal treatment at 980° C. for 30 seconds was performed, and the disordering degree of the quantum well active layer was measured. The disordering degree is given by the energy shift (meV), which is calculated from the magnitudes of the shift of the photoluminescence spectrum peak wavelengths at the room temperature observed between the wavelengths before and after the thermal treatment. In FIG. 8, the plots given by black circle marks show the measurements when the SiN films were formed with catalytic CVD method, and the plots given by ○ marks show the measurements wherein the SiN films were formed with plasma CVD method (PECVD: Plasma Enhanced CVD) as a comparative example. The conditions of the film formation used in each method for film formation are as follows. When the flow rate of silane is increased in FIG. 8, the refractive index of the film becomes larger.

(Film Formation Conditions of the SiN Film by Catalytic CVD Method)

Film thickness of the deposited SiN film: 50 nm,

Gas pressure (Pressure in the chamber): 4.0 Pa,

Substrate temperature: 250° C.,

Tungsten wire temperature: 1650° C.,

Flow rate of ammonia: 0.2 L/min,

Flow rate of silane: 0.001 to 0.003 L/min.

(Film Formation Conditions of the SiN Film by Plasma CVD Method)

Film thickness of the deposited SiN film: 50 nm,

RF power: 190 mW,

Gas pressure (Pressure in the chamber): 50 Pa,

Substrate temperature: 250° C.,

Flow rate of nitrogen: 0.28 L/min,

Flow rate of silane: 0.004 to 0.008 L/min,

In FIG. 8, the film composition in the case of plasma CVD method was changed by altering the flow rate of supplied silane.

As seen in FIG. 8, in the case where the SiN film is formed with catalytic CVD method under the above-described film formation conditions, the magnitude of energy shift seen between after and before the thermal treatment is small when the refractive index of the deposited film is larger than about 1.96, and the magnitude of energy shift is large when it is smaller than 1.96. This means that the deposited film functions as the protective film 10 when its refractive index is larger than about 1.96, and functions as the disordering-enhancing film 12 when it is smaller than 1.96.

Based on this finding, in the case of forming the SiN$_{x1}$ protective film 10 in the present embodiment, the flow rates were set to f$_{NH3}$=0.2 L/min and f$_{SiH4}$=2.5×10$^{-3}$ L/min, and in the case of forming the SiN$_{x2}$ disordering-enhancing film 12, the flow rates were set to f$_{NH3}$=0.2 L/min and f$_{SiH4}$=2.0×10$^{-3}$ L/min. The pressure in the chamber was 4.0 Pa when either of dielectric films was formed. The refractive indices of the protective film and the disordering-enhancing film measured under these conditions were 2.02 and 1.94, respectively.

The relationship between the composition of formed SiN$_x$ and the flow rate of the source gas may be different depending on every catalytic CVD apparatus or on every film formation condition (the gas pressure, the substrate temperature, the tungsten wire temperature, and the like at the time of film formation), so that it is desirable to check the composition of SiN$_x$ by such as the refractive-index measurement for every catalytic CVD apparatus or for every film formation condition.

For example, when the SiN film is formed in the same way as above by setting the gas pressure at the time of film formation to 2.0 Pa, the inventor has found that separated by a boundary at which the composition has the refractive index of nearly 2.07, the deposited SiN film with a composition of more Si (the refractive index>2.07) functions as a high density protective film, and the SiN film with the composition of less Si (refractive index<2.07) functions as a low density disordering-enhancing film. In this way, by determining the boundary composition for every catalytic CVD apparatus or the film formation conditions with regards to whether the obtained film functions as a protection film or as a disordering-enhancing film, and by adjusting the flow rate of the source gas based on this, either the protection film or the disordering-enhancing film can be fabricated differentially.

Although the reason why the deposited film is determined to function as a protective film or as a disordering-enhancing film, separated by the predetermined boundary flow rate of source gas which is dependent on the film formation conditions, has not yet been completely elucidated, the inventor thinks as follows with regards to this. That is, in the case where the dielectric films (SiN$_x$ films) with various compositions are formed with catalytic CVD method under various flow rate of silane, if the flow rate of silane is large, the film takes up many Si atoms and becomes a high density film, and if the flow rate of silane is small, it becomes a low density film. The dielectric film with low density is thought to have large skeletal atom intervals and so when it is formed on a semiconductor crystal and heat treated, Ga atoms belonging to the III group are easily absorbed into the dielectric film from the semiconductor crystal. That is, atomic vacancies are easy to be formed in the semiconductor crystal by a lack of atoms.

In contrast to this, the skeletal atom intervals are thought to be narrow in the dielectric film with high density. Therefore, when the dielectric film is formed on the semiconductor crystal and heat treated, Ga atoms are rarly absorbed into the dielectric film from the semiconductor crystal. That is, atomic vacancies are difficult to be formed in the semiconductor crystal.

Due to such differences in the property, the dielectric film with high density functions as the protective film for disordering of the quantum well, and the film with low density functions as the enhancing film.

Although measurement of the magnitude of the film density is generally difficult, it can be discriminated by measuring the refractive index. In the present example, the inventor has found out that it is possible to determine that, as shown in FIG. 8, when the refractive index is larger than the predetermined value decided depending on the film formation conditions, the film functions as a protection film, and when it is smaller than said predetermined value, the film functions as a disordering-enhancing film, respectively.

Further, when the composition ratio of Si contained in the dielectric film is larger than the stoichiometric composition ratio of Si of said dielectric film, the film functions as a large density protective film, and when the composition ratio of Si is smaller than the stoichiometric composition ratio of Si of said dielectric film, it functions as a low density disordering-enhancing film.

Next, paying attention on the quantity of the hydrogen atoms taken into the dielectric film, a film containing more hydrogen atoms in it has larger skeletal atom intervals, and so when it is formed on a semiconductor crystal and heat treated, Ga atoms are easily absorbed into the dielectric film from the semiconductor crystal. That is, atomic vacancies are easily produced in the semiconductor crystal. In contrast to this, a film containing small amount of hydrogen has narrow skeletal atom intervals, and so when it is formed on a semiconductor crystal and heat treated, Ga atoms are rarely absorbed into the dielectric film from the semiconductor crystal. That is, atomic vacancies are rarely produced in the semiconductor crystal. Therefore, a dielectric film containing low hydrogen concentration in the film functions as a protective film and the one containing high hydrogen concentration functions as an enhancing film.

In addition, as is seen in FIG. 8, the magnitude of energy shift between before and after the thermal treatment changes more steeply around a standard value determined according to the film formation conditions in the case where the film is formed using catalytic CVD method as compared with the case where it is formed using plasma CVD method. The conceivable reason is that a compact film is easily formed with the catalytic CVD method and so this method is suitable for fabricating a protective film and a disordering-enhancing film differentially by making use of a film density difference. However, by using film formation conditions to acquire a compact film with some certainty, the present invention may be applicable by adopting film formation methods other than the catalytic CVD method.

Since the $SiN_{x1}$ protective film 10 is formed with the catalytic CVD method on the region where the window is not formed, the $SiN_{x1}$ protective film 10 is compact and with low stress, and so desorption of atoms such as As from the semiconductor surface during the thermal treatment for disordering can be fully prevented. Therefore, according to the present invention, since such a problem that the pits produced by desorption of As atoms rough the surface of the contact layer 9 does not arise, a favorable film contact to the upper electrode 21 is assured. Further, since the semiconductor is free from the problem that pits make dislocation defects which spread to the active layer during the laser operation, the semiconductor laser excellent in long-term reliability can be obtained.

Main advantages obtained by using the $SiN_x$ film produced by catalytic CVD method as the disordering-enhancing film, instead of using conventional $SiO_2$, are explained below, taking into account the experimental results.

(Advantages of Using the $SiN_x$ Disordering-Enhancing Film Fabricated by Catalytic CVD Method: 1)

Because $SiN_x$ is used instead of conventional $SiO_2$ as the disordering-enhancing film in the present embodiment, mixing of oxygen atoms into the semiconductor crystal may not take place. That is, from the $SiO_2$ film conventionally formed on the surface of a semiconductor crystal, oxygen atoms diffuse into the semiconductor multilayer to make crystal defect and cause lowering of the long-term reliability. However, since $SiN_x$ does not contain oxygen essentially, there are few problems caused by oxygen.

(Advantage of Using the $SiN_x$ Fabricated by Catalytic CVD Method: 2)

In order to pattern the $SiN_{x1}$ protective film 10 only on the region not to be disordered in the present embodiment, the contact layer 9 at the end part of the semiconductor laser is exposed by etching the $SiN_{x1}$ protective film 10 with the reactive ion etching using $CF_4$ (FIG. 2 (b)). Then $SiN_{x2}$ disordering-enhancing film 12 is deposited on it, and the interface between the contact layer 9 and the film 12 is very favorable since the catalytic CVD method is used for depositing the $SiN_{x2}$ disordering-enhancing film 12. Conceivably, it may be because in the catalytic CVD method, the surface of the contact layer 9 is etched by hydrogen radicals, which has a cleaning effect. On the other hand, when the disordering-enhancing film is formed on the contact layer 9 which had received fluoride etching process by using frequently used conventional methods, such as the plasma CVD method and the EB vapor deposition, pit-like roughness may sometimes occur on the surface of the contact layer 9 under the $SiN_{x2}$ disordering-enhancing film 12.

The following experiments were conducted in order to confirm this. The following two kinds of samples A and B were fabricated by using the epitaxial wafer having the same laser structure as one shown in the present embodiment. On the semiconductor multilayer of the sample A, RIE processing using $CF_4$ was performed and then $SiO_2$ film was formed by EB vapor-depositing method. The $SiO_2$ film was formed to the thickness of 20 nm by setting the substrate temperature to 180° C. On the semiconductor multilayer of the sample B, RIE processing using $CF_4$ was performed and then a $SiN_x$ film was formed by catalytic CVD method. The $SiN_x$ film was formed with the thickness of 50 nm, setting the flow rate of silane, $f_{SiH4}=2\times10^{-3}$ L/min. Numbers of the pits generated on the semiconductor multilayer surface were measured on the samples A and B. The sample A had 3000 pits/cm², and the sample B had 500 pits/cm² or less. In fabricating the sample B, the number of pits did not increase even if the flow rate of SiH₄ was changed.

In this way, the number of pits produced on the surface of the compound semiconductor multilayer below the dielectric film can be suppressed to be low by forming the dielectric film with catalytic CVD method. Thereby, reliability of a semiconductor laser device is expected to be secured.

As the formation order of the dielectric films, the present embodiment has explained the case where after forming a protective film on the semiconductor laser surface in the region other than the region to be disordered, the disordering-enhancing film covering at least the region to be disordered is formed. Forming the low density disordering-enhancing film on the high-density protective film in this way has an advantage that the gas absorbed in the film during the protective film formation is efficiently released to outside through the low density disordering-enhancing film during the thermal treatment for disordering.

Figure 9:
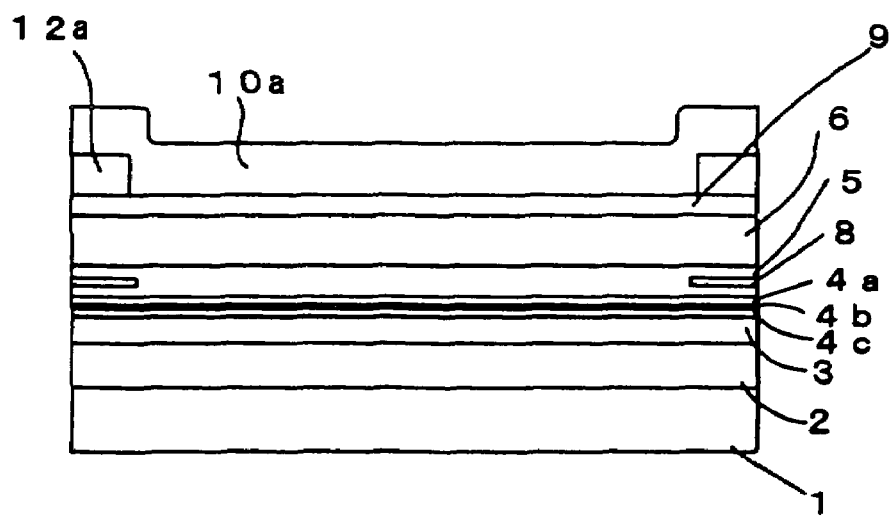
FIG. 9 is a cross section for illustrating another fabrication mode of dielectric films, in the method of fabricating the semiconductor laser device according to an example of the present invention.

However, the formation order of the dielectric film is not restricted to the above order, but may also be reversed. That is, as shown in FIG. 9, when the disordering-enhancing film is formed in advance, and next the protective film is formed so as to cover the enhancing film from above to cover the region to be disordered, impurities such as Ga atoms existing in the atmosphere in the thermal treatment furnace do not dissolve into the low density disordering-enhancing film from the exterior to diffuse during the thermal treatment. It is thus advantageous because the change in the amount of Ga absorbed by the disordering-enhancing film from the semiconductor multilayer during the thermal treatment is suppressed and the function as the disordering-enhancing film is stabilized Although $SiN_x$ was used as the protective film and the disordering-enhancing film in this embodiment, it is needless to say that other kinds of dielectric films may be adopted, as long as they can absorb the constituent atoms in the semiconductor crystal to generate atomic vacancies in said semiconductor crystal, and the density of the deposited film is controllable by the film formation conditions. The deposition method of these dielectric films is also not restricted to the catalytic CVD method, and as long as the film formation conditions capable of controlling the densities of the deposited films are used, plasma CVD method, EB vapor-depositing method, spin coat method and the like can be used, for example.

[Current Non-Injection Structure]

Next, as shown in FIG. 4 (b), a current non-injection structure formed by the fabricating method according to one aspect of the present invention has a layer of length Ln with the conduction type opposite to that of the upper cladding layer 6, near the facet in the upper cladding layer 6. In this current non-injection structure, the length Lw of the window is 10 μm and the length Ln of the current non-injection layer 8 is 20 μm which is longer than the length Lw of the window. Due to the existence of current non-injection layer 8, the current supplied to the semiconductor laser is not injected into the region where the atomic vacancies were introduced by the thermal treatment for disordering, and so degradation of the crystal quality is prevented and reliability of the semiconductor laser device is improved. The non-light-emitting recombination near the facet is suppressed, which is still more effective for prevention of COD, jointly with the window structure formed by disordering. If Ln is made longer than Lw+10 μm, enough current may not be injected into the active layer region. For this reason, the length Ln of the current non-injection layer 8 is preferably less than Lw+10 μm, setting the length of the disordered portion (the window) measured from the end of the semiconductor laser device to Lw. The relation, Ln<Lw may also be possible. Here, the length of Ln and Lw are the lengths along the longitudinal direction of the resonator.

The current non-injection layer 8 is also formed consecutively in the regions on both sides of the stripe-shaped resonator in the longitudinal direction, in order to serve, in addition, as a low refractive index layer for confining light in the transverse direction. Therefore, both the transversal confining structure of the waveguide mode and the current non-injection structure can be fabricated at once by one mask patterning for forming the current non-injection layer 8.

Figure 1A:
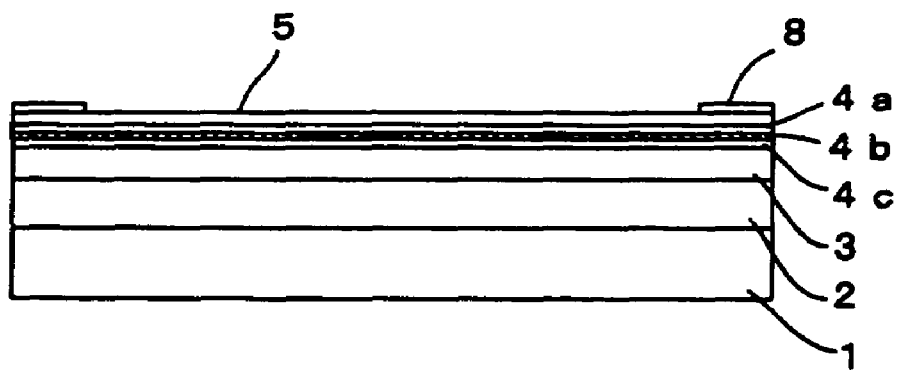
FIGS. 1 (a) and 1 (b) are cross sections illustrating fabrication of an epitaxial wafer of a semiconductor laser device according to an embodiment of the present invention.
Figure 1B:
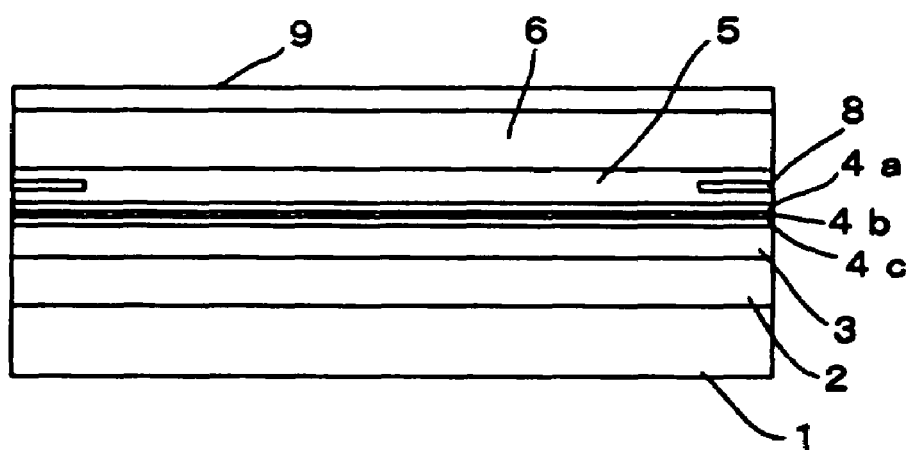
Figure 5A:
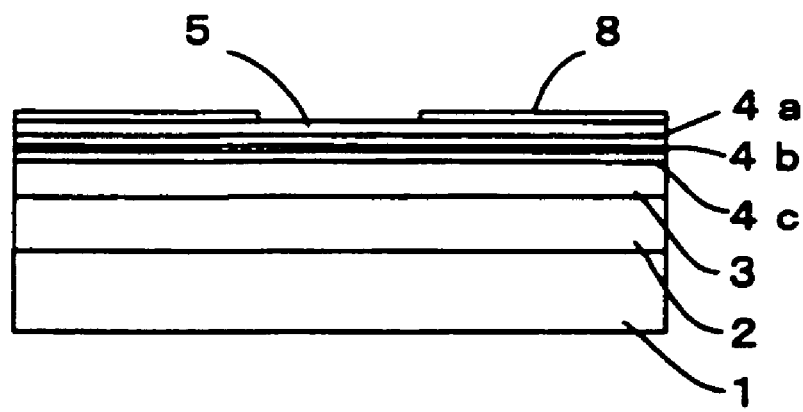
FIGS. 5 (a) and 5 (b) are cross sections seen from the facet side, illustrating fabrication of an epitaxial wafer of a semiconductor laser device according to an embodiment of the present invention.
Figure 5B:
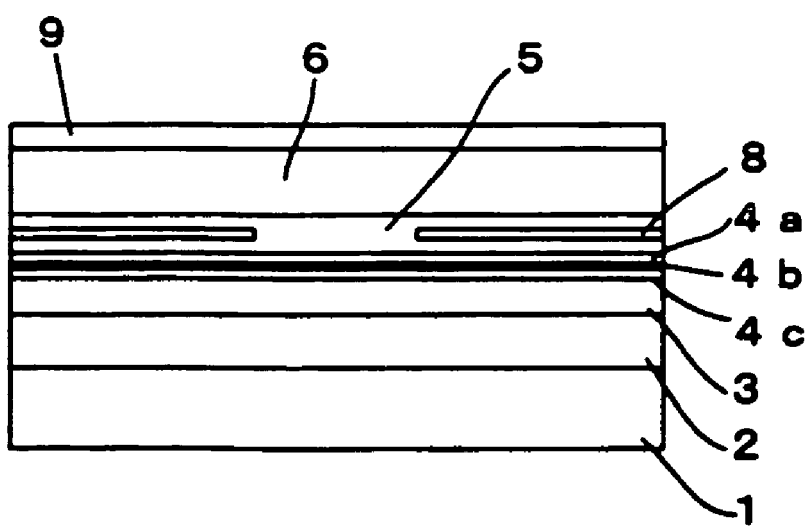

Such a current non-injection structure is formed as shown in FIGS. 1 and 5. After forming the upper optical waveguide layer 5 partway above the upper carrier block layer 4a formed on the multiple quantum well active layer 4b, the stripe-shaped semiconductor layer (the current non-injection layer) 8 is selectively deposited in the region stretching from the position which is destined for a facet of the semiconductor laser later to the position which is apart by the length Ln in the center direction (see FIG. 1(a)), and in the region on both sides of the stripe-shaped resonator in the longitudinal direction (see FIG. 5(a)); and then, the remaining upper optical waveguide layer 5 is formed to bury said semiconductor layer 8. Here, the conductive type of the current non-injection layer 8 is made opposite to that of the upper waveguide layer 5 in which it is embedded.

Although a semiconductor layer 8 having a conduction type opposite to the upper waveguide layer 5 is embedded in the upper optical waveguide layer 5 in the above explanation, the current non-injection structure may be formed by embedding a semiconductor layer having a conduction type opposite to the lower waveguide layer 3 in the lower waveguide layer 3, or may be formed by embedding the semiconductor layer having the conduction type opposite to each conduction type in both the upper waveguide layer 5 and the lower waveguide layer 3.

[DCH Structure]

Figure 10A:
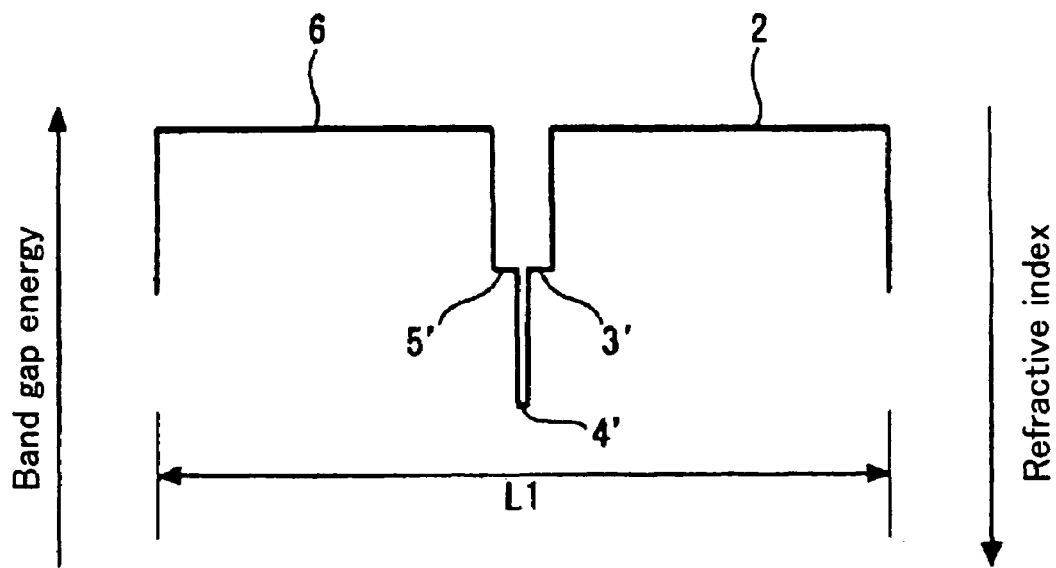
FIG. 10 (a) is a schematic diagram illustrating distribution of the band gap energy in SCH structure according to the present invention, and FIG. 10 (b) is a schematic diagram illustrating distribution of the band gap energy in DCH structure.
Figure 10B:
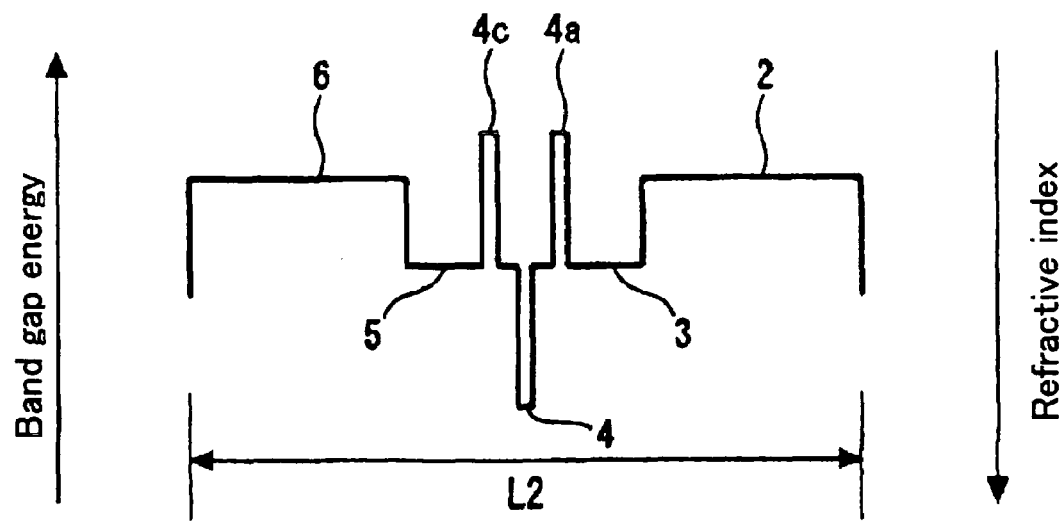

The DCH structure formed by the fabricating method according to one aspect of the present invention has carrier block layers in the waveguide region. On the other hand, as a high-output semiconductor laser device, the separate confinement heterostructure (SCH) has been often used conventionally. In FIGS. 10(a) and 10(b), the band gap energy distributions (left side ordinate) and the refractive index distributions (right side ordinate) of both structures are shown. FIG. 10 (a) shows the SCH structure having optical waveguide layers 3' and 5' on both sides of an active layer 4'. FIG. 10 (b) shows the DCH structure adopted by the semiconductor laser device of the present embodiment. The distribution-shapes of the band gap energy and the refractive index of each layer inside the quantum well structures of the active layers 4 and 4' are omitted.

The guide mode of the laser light emitted from the DCH structure is closer to Gauss-type compared with the SCH structure and the light-leak to the cladding layer is small. So that, when the lasers are designed to have the same oscillation wavelength and the same radiation angle, the film thickness (L2 in FIG. 10 (b)) of the whole laser structure of the DCH-structured laser can be thinner compared with the whole film thickness (L1 in FIG. 10 (a)) of the SCH-structured laser. Therefore, in the semiconductor laser device having a window structure formed as a result of disordering of the multiple quantum well layers by diffusion of atomic vacancies, the diffusion length of atomic vacancies required for disordering can be shortened by adopting the DCH structure. For this reason, the thermal treatment for disordering can be performed at a lower temperature, and the damage given by the thermal treatment for disordering to the laser crystallinity can be suppressed to a minimum.

In the SCH structure, in order to confine the carriers efficiently in the active layer, Al composition ratio of the optical waveguide layer 3' has had to be high to some extent. On the other hand, in the DCH structure, since the carrier block layers 4a and 4c assume the role to confine the carriers, the optical waveguide layer 3 does not have to be of high Al composition ratio, and can be constituted from GaAs. If the optical waveguide layer is constituted from GaAs, an accumulation of oxygen to the re-grown interface, which tends to take place in the AlGaAs layer of high Al composition ratio, will be suppressed. Thus, formation of a potential barrier at the re-grown interface is suppressed, and rise in the operating voltage can be avoided. Since the non-light-emitting recombination is suppressed by the suppression of oxygen accumulation at the re-grown interface, the semiconductor laser device has excellent long-term reliability.

Such a DCH structure is formed, as shown in FIGS. 1 and 5, by depositing the upper carrier block layer 4a and the lower carrier block layer 4c each having band gap energies larger than each band gap energy of the optical waveguide layers 5 and 3, between the multiple quantum well active layer 4b and the upper optical waveguide layer 5, and between the multiple quantum well active layer 4b and the lower optical waveguide layer 3, respectively.

EXAMPLE

On a GaAs substrate of 2 inches in diameter, a semiconductor multilayer structure was formed as shown in FIG. 1 (b). The multilayer structure consists of a n-$Al_{0.08}Ga_{0.92}As$ lower cladding layer 2 with a thickness of 2.4 μm, a n-GaAs lower waveguide layer 3 with a thickness of 0.48 μm, a n-$Al_{0.4}Ga_{0.6}As$ lower carrier block layer 4c with a thickness of 0.035 μm, a multiple quantum well active layer 4b with two stacked $In_{0.14}Ga_{0.86}As$ quantum well layers each with a thickness of 0.01 μm, a p-$Al_{0.4}Ga_{0.6}As$ upper carrier block layer 4a with a thickness of 0.035 μm, an upper waveguide layer 5 with a thickness of 0.45 μm, a p-$Al_{0.32}Ga_{0.68}As$ upper cladding layer 6 with a thickness of 0.8 μm, and a p-GaAs contact layer 9 with a thickness of 0.3 μm grown in this order on a n-GaAs substrate 1. A stripe-shaped n-$Al_{0.32}Ga_{0.68}As$ layer 8 with a thickness of 0.055 μm is embedded at the predetermined intervals in the upper waveguide layer 5. The photoluminescence peak wavelength measured on the semiconductor substrate having such a multilayer structure corresponded to 1.276 eV in terms of the band gap energy.

Next, as shown in FIG. 2 (a), using catalytic CVD method, the $SiN_{x1}$ protective film 10 with a thickness of 50 nm was formed on the entire upper surface of the contact layer 9. Film formation by the catalytic CVD method was performed, setting the pressure in the chamber to 4.0 Pa, temperature of the substrate at 250° C. and temperature of the tungsten wire at 1650° C., and by supplying ammonia and silane as the source gases with the flow rate of 0.2 L/min and 0.0025 L/min, respectively. The refractive index of the deposited $SiN_{x1}$ protective film 10 measured with an ellipsometer was 2.02.

Thereafter, resist patterning was performed on the upper surface of the $SiN_{x1}$ protective film 10 using photolithography to form a resist mask 11 covering the semiconductor except for the region near the facets. The $SiN_{x1}$ protective film 10 was etched using this resist mask 11 by the reactive ion etching (RIE) using carbon tetrafluoride ($CF_4$), and then the resist mask 11 was removed by an organic solvent (FIG. 2 (b)). Thereby, a part of contact layer 9 was exposed.

On the entire upper surface of the exposed contact layer 9 and the $SiN_{x1}$ protective film 10, the $SiN_{x2}$ disordering-enhancing film 12 with a thickness of 25 nm was formed using catalytic CVD method (FIG. 2 (c)). The film formation by catalytic CVD method was performed, by setting the pressure in a chamber to 4.0 Pa, the temperature of the substrate at 250° C. and the temperature of the tungsten wire at 1650° C., and supplying ammonia and silane as the source gases with the flow rate of 0.2 L/min and 0.002 L/min, respectively. The refractive index of the deposited $SiN_{x2}$ disordering-enhancing film 12 measured with an ellipsometer was 1.94.

Next, as shown in FIG. 6, the semiconductor substrate was placed on a mount 15 made of silicon carbide (SiC) installed in a quartz tray 14, and was heated in nitrogen ($N_2$) gas atmosphere for 30 seconds at the temperature of 930° C. with a lamp heater 16 arranged under the quartz tray 14. Then the $SiN_{x1}$ protective film 10 and the $SiN_{x2}$ disordering-enhancing film 12 were removed with hydrofluoric acid (FIG. 3 (b)). Then, the photoluminescence peak wavelengths were measured at the portions where the $SiN_{x1}$ protective film 10 and the $SiN_{x2}$ disordering-enhancing film 12 had been formed, and were compared with those measured before the thermal treatment. At the portion where the $SiN_{x1}$ protective film 10 had been formed, a shift (wavelength-shortening) of about 5 meV or less in terms of band gap energy was observed, while at the portion where the $SiN_{x2}$ disordering-enhancing film 12 had been formed, a shift of about 35 meV was observed.

Thereafter, the GaAs substrate was cleaved near the center of the n-$Al_{0.32}Ga_{0.68}As$ layer 8 embedded in a shape of stripe (FIG. 4 (a)), to be plural laser bars. And the cleaved surface on the side destined for the light emitting facet was coated by a low reflection film 23, and the cleaved surface on the opposite side was coated by a high reflection film 24 (FIG. 4 (b)). Finally, each laser bar was divided with the prescribed interval, and individual semiconductor laser devices were obtained.

Figure 11:
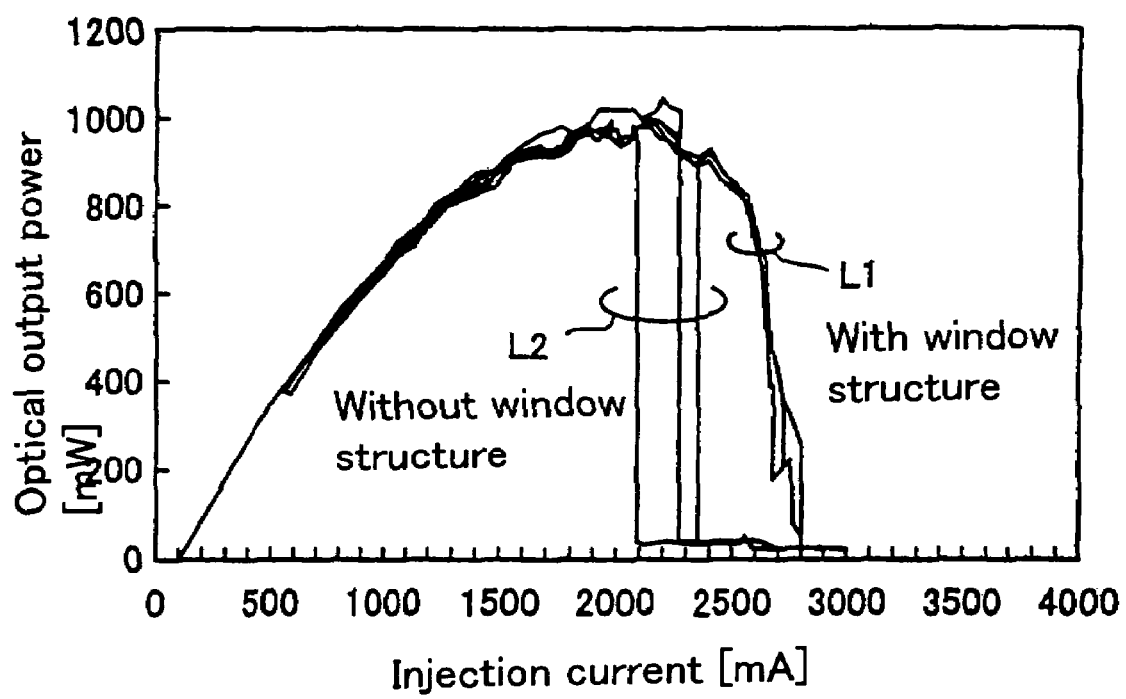
FIG. 11 is a figure showing injection current dependence of optical output power in a semiconductor laser device having window structures fabricated by a method of fabrication according to an example of the present invention, and a semiconductor laser device not having window structures.
Figure 12:
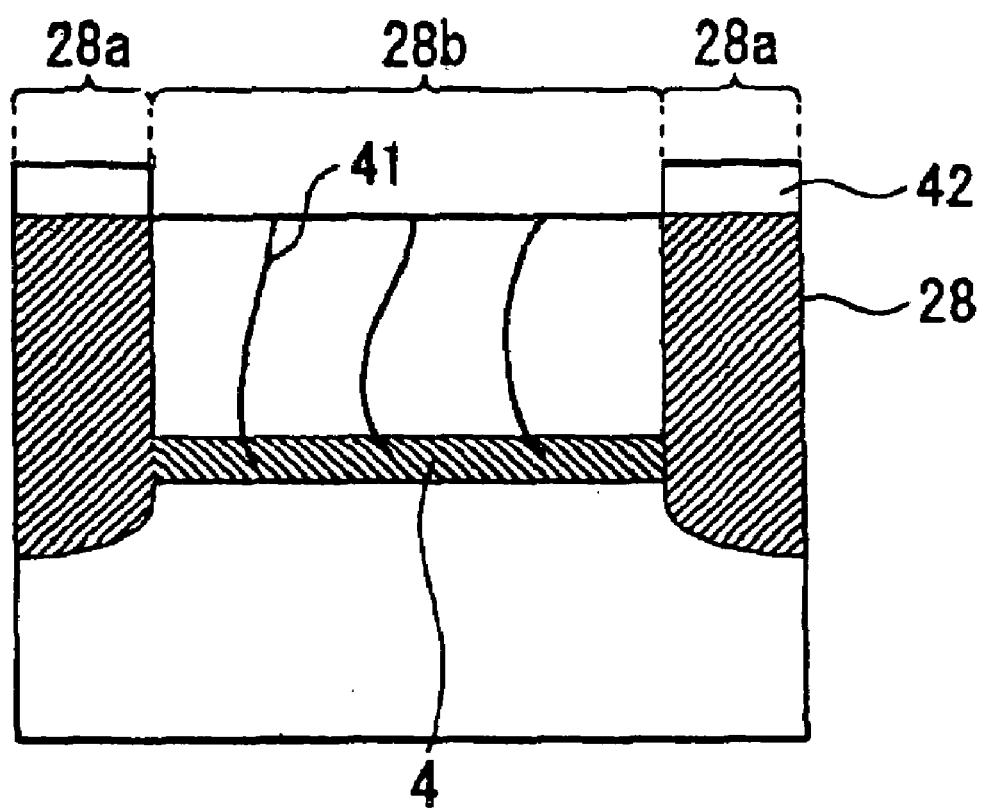
FIG. 12 is a schematic diagram illustrating a phenomenon during thermal treatment for disordering in a semiconductor laser device having conventional window structures.

On the semiconductor laser device fabricated in this way, the current optical output power characteristic (the injection current dependence of the optical output power) was measured. This is shown in FIG. 11. As a comparative example, the current optical output power characteristic was also measured on the semiconductor laser device without the window structure. As shown by the curves L2 in FIG. 11, in the semiconductor laser device without the window structure, the optical output power suddenly became zero due to COD when the injection current reached a certain level. On the other hand, in the semiconductor laser device produced with the fabricating method of the present example, COD did not occur but only reduction of the optical output power by heat saturation was observed.

Moreover, this semiconductor laser device has such features that, in the fabricating process, removal of As atoms from the semiconductor surface with the thermal treatment for disordering is stopped, and no contamination of oxygen atoms occurs during the thermal treatment for disordering; and that the current non-injection structure and the DCH structure are adopted, so that it shows a long-term excellent reliability.

Although in the above-described explanation, the case where the fabricating method according to the present invention was applied to the semiconductor laser device of 0.98 μm band was explained, the fabricating method of the present invention is applicable also to the semiconductor laser devices of other wavelength bands. It is needless to say that the fabricating method of the present invention can be applied to both semiconductor laser devices generating a transverse single mode oscillation and generating a transverse multiple mode oscillation. In addition, although the above explanation was about the semiconductor laser device having a single light emitting stripe, it is needless to say that the present invention can be applied to the array laser arranged by two or more light emitting stripes, either.

The explanation was done on the semiconductor laser having a multiple quantum well layer in the above explanation. However, when a semiconductor laser with a single quantum well layer is formed, the window structure may be also formed using the fabricating method of the present invention to prevent COD. Moreover, the fabricating method of the present invention can be used not only to form the window structures on the semiconductor device for preventing COD, but also can be used more generally to broaden the energy band gap of a specific portion of a compound semiconductor multilayer of a semiconductor device. For example, if the disordering-enhancing film is formed on the regions of the surface of the contact layer 9 which are above the regions locating on both sides of the current injection region of the active layer 4b, and is heat treated, said regions locating on both sides of the active layer 4b will be disordered and the refractive index thereof will become small. Thus, the distribution of the refractive indices in the transverse direction consisting of the disordered region and the active layer can function to confine the light in the transverse direction.

The invention claimed is:

1. A method of fabricating a semiconductor device, the method comprising the steps of:
    forming a predetermined semiconductor multilayer which includes at least an active layer comprising a quantum well active layer on a semiconductor substrate;
    forming a disordering-suppressing film on a first portion of the surface of said semiconductor multilayer;
    forming a disorder-enhancing film on a second portion of the surface of said semiconductor multilayer, said disorder-enhancing film being made of the same dielectric material as said disordering-suppressing film and having a lower density than said disordering-suppressing film in order that catastrophic optical damage (COD) to the laser type semiconductor device is reduced;
    performing thermal treatment of a multilayer body containing said semiconductor multilayer, said disordering-suppressing film and said disorder-enhancing film, thus disordering said quantum well layer under said disorder-enhancing film so as to have an increased band gap energy higher than that of said quantum well layer under said disordering-suppressing film; and
    cleaving said multilayer body at nearly the central part of said second portion.

2. The method of fabricating the semiconductor device according to claim 1, wherein said disordering-suppressing film and said disorder-enhancing film are silicon nitride films.

3. The method of fabricating the semiconductor device according to claim 1, wherein said disordering-suppressing film is formed by the steps of:
    arranging a heat source in a chamber on a path through which a first precursor of said disordering-suppressing film passes to cause a decomposition reaction of said first precursor in the presence of said heat source, and exposing said first portion of said semiconductor device in said chamber; and
    said disorder-enhancing film is formed by the steps of:
    arranging a heat source in said chamber on a path through which a second precursor of said disorder-enhancing film passes to cause a decomposition reaction of said second precursor in the presence of said heat source, and exposing said second portion of said semiconductor device in said chamber.

4. The method of fabricating the semiconductor device according to claim 3, wherein said first precursor and said second precursor contain silane and ammonia, and the silane content in said first precursor is larger than the silane content in said second precursor.

5. The method of fabricating the semiconductor device according to claim 3, wherein said disordering-suppressing film and disorder-enhancing film are respectively formed by the step of causing decomposition reactions of said first precursor and said second precursor with catalytic CVD method.

6. The method of fabricating the semiconductor device according to claim 1, wherein said disordering-suppressing film is formed by the steps of:
    arranging a heat source in a chamber on a path through which a first precursor of said disordering-suppressing film passes to cause a decomposition reaction of said first precursor in the presence of said heat source, and exposing said first portion of said semiconductor device in said chamber; and
    said disorder-enhancing film is formed by the steps of:
    arranging a heat source in said chamber on a path through which a second precursor of said disorder-enhancing film passes to cause a decomposition reaction of said second precursor in the presence of said heat source, and exposing said second portion of said semiconductor device in said chamber; and
    said first and second precursors are compounds containing nitrogen and silicon, or mixtures of nitrogen compounds and silicon compounds.

7. The method of fabricating the semiconductor device according to claim 1, wherein said predetermined semiconductor multiplayer is formed by the steps of:
    forming an optical waveguide layer, at least on one side of said quantum well layer in the layer forming direction, and
    embedding a semiconductor layer with a conduction type opposite to the conduction type of said optical waveguide layer into said optical waveguide layer at the portion beneath said second portion.

8. The method of fabricating the semiconductor device according to claim 1, wherein said predetermined semiconductor multilayer is formed by the steps of:
    forming optical waveguide layers having band gap energies larger than the band gap energy of said quantum well layer on both sides of said quantum well layer in the layer forming direction, respectively;
    forming cladding layers having band gap energies larger than the band gap energies of said optical waveguide layers on both sides in the layer forming direction of the multilayer structure comprising said quantum well layer and said optical waveguide layers, respectively; and
    forming carrier blocking layers having band gap energies larger than each band gap energy of said optical waveguide layers between said quantum well layer and said optical waveguide layers.

9. The method of fabricating the semiconductor device according to claim 1, wherein said predetermined semiconductor multilayer is formed by the step of forming either a single or a multiple quantum well structure.

* * * * *